(12) United States Patent
Tsai et al.

(10) Patent No.: US 12,184,172 B2
(45) Date of Patent: Dec. 31, 2024

(54) SWITCH DEVICE CAPABLE OF PROVIDING A DISCHARGE PATH ACCORDING TO SIGNAL LEVEL OF AN INPUT SIGNAL

(71) Applicant: RichWave Technology Corp., Taipei (TW)

(72) Inventors: Hsien-Huang Tsai, Taipei (TW); Chih-Sheng Chen, Taipei (TW); Tien-Yun Peng, Taipei (TW)

(73) Assignee: RichWave Technology Corp., Taipei (TW)

(*) Notice: Subject to any disclaimer, the term of this patent is extended or adjusted under 35 U.S.C. 154(b) by 0 days.

(21) Appl. No.: 18/089,580

(22) Filed: Dec. 28, 2022

(65) Prior Publication Data

US 2024/0162814 A1 May 16, 2024

(30) Foreign Application Priority Data

Nov. 16, 2022 (TW) .................................. 111143672

(51) Int. Cl.
*H03K 17/10* (2006.01)
*H02M 3/07* (2006.01)

(52) U.S. Cl.
CPC .......... *H02M 3/071* (2021.05); *H03K 17/102* (2013.01)

(58) Field of Classification Search
None
See application file for complete search history.

(56) References Cited

U.S. PATENT DOCUMENTS 5,297,104 A * 3/1994 Nakashima ......... G11C 11/4085
365/189.11
5,680,300 A * 10/1997 Szepesi .................. H02M 3/07
363/59

(Continued)

FOREIGN PATENT DOCUMENTS

CN  104866888 A   8/2015
TW  201044782 A1  12/2010

(Continued)

OTHER PUBLICATIONS

Chen, the specification, including the claims, and drawings in the U.S. Appl. No. 18/091,343, filed Dec. 29, 2022.

(Continued)

*Primary Examiner* — Thomas J. Hiltunen
(74) *Attorney, Agent, or Firm* — Winston Hsu (57) ABSTRACT

A switch device includes a driver circuit, a switch circuit and a level transition circuit. The driver circuit includes an input terminal for receiving an input signal, an output terminal for outputting an output signal, a first terminal coupled to a first reference terminal, and a second terminal coupled to a second reference terminal. The switch circuit includes a control terminal for receiving the output signal. The level transition circuit includes a first terminal for receiving the output signal, a second terminal coupled to a third reference terminal, and a third terminal for receiving the input signal. In a transition interval, the input signal is transitioned from a first input signal level to a second input signal level, the level transition circuit transitions the output signal from a first output signal level to a third output signal level between the first output signal level and a second output signal level.

19 Claims, 6 Drawing Sheets

(56) References Cited

U.S. PATENT DOCUMENTS

| | | | | |
|---|---|---|---|---|
| 5,929,665 | A * | 7/1999 | Ichikawa | H03K 17/168 |
| | | | | 327/109 |
| 5,986,484 | A * | 11/1999 | Kimata | H03K 17/0828 |
| | | | | 327/108 |
| 6,016,281 | A * | 1/2000 | Brox | G11C 11/4085 |
| | | | | 365/189.11 |
| 6,271,708 | B1 * | 8/2001 | Hoshi | H03K 17/567 |
| | | | | 327/377 |
| 6,333,665 | B1 * | 12/2001 | Ichikawa | H03K 17/168 |
| | | | | 327/434 |
| 6,370,069 | B2 * | 4/2002 | Brass | G11C 29/26 |
| | | | | 365/201 |
| 6,535,020 | B1 * | 3/2003 | Yin | H03K 19/00384 |
| | | | | 326/26 |
| 7,519,135 | B2 | 4/2009 | Staszewski | |
| 7,710,187 | B2 * | 5/2010 | Hiyama | H03K 17/74 |
| | | | | 327/434 |
| 8,138,818 | B2 * | 3/2012 | Tsunoda | H03K 17/168 |
| | | | | 327/434 |
| 8,203,377 | B2 * | 6/2012 | Kelley | H03K 17/04123 |
| | | | | 327/170 |
| 8,963,576 | B2 | 2/2015 | Callanan | |
| 9,019,001 | B2 * | 4/2015 | Kelley | H03K 17/04123 |
| | | | | 327/434 |
| 9,100,019 | B2 * | 8/2015 | Akiyama | H03K 17/162 |
| 9,496,864 | B2 * | 11/2016 | Wagoner | H03K 17/166 |
| 9,621,153 | B2 * | 4/2017 | Ikeda | H03K 17/063 |
| 9,685,945 | B2 * | 6/2017 | Osanai | H03K 17/162 |
| 10,044,349 | B2 | 8/2018 | Scott | |
| 10,270,437 | B2 | 4/2019 | Scott | |
| 10,511,301 | B2 * | 12/2019 | Akiyama | H03K 17/163 |
| 10,523,194 | B2 | 12/2019 | Raszka | |
| 10,680,601 | B1 * | 6/2020 | Kempitiya | H03K 17/08116 |
| 10,848,145 | B2 * | 11/2020 | Ishii | H02M 1/08 |
| 11,258,443 | B2 * | 2/2022 | Sahoo | H02M 1/32 |
| 11,437,911 | B2 * | 9/2022 | Duvnjak | H02M 3/156 |
| 2009/0066402 | A1 * | 3/2009 | Hiyama | H03K 17/168 |
| | | | | 327/392 |
| 2009/0167368 | A1 * | 7/2009 | Chan | H03K 19/01721 |
| | | | | 327/108 |
| 2013/0076322 | A1 * | 3/2013 | Tateno | H02M 3/158 |
| | | | | 323/271 |
| 2022/0310148 | A1 | 9/2022 | Ikeda | |

FOREIGN PATENT DOCUMENTS

| | | |
|---|---|---|
| TW | 1348270 | 9/2011 |
| TW | 201242231 A1 | 10/2012 |
| TW | 201532388 A | 8/2015 |
| TW | I575872 B | 3/2017 |
| TW | 202111551 A | 3/2021 |
| TW | 202203590 A | 1/2022 |

OTHER PUBLICATIONS

Office action mailed on Nov. 23, 2023 for the Taiwan application No. 111143672, filing date Nov. 16, 2022, pp. 1-4. ,Nov. 23, 2023.

Office action mailed on Jan. 23, 2024 for the Taiwan application No. 111147999, filing date Dec. 14, 2022, pp. 1-5. ,Jan. 23, 2024.

Office action mailed on Mar. 18, 2024 for the U.S. Appl. No. 18/091,343, filed Dec. 29, 2022, pp. 1-21.

* cited by examiner

SWITCH DEVICE CAPABLE OF PROVIDING A DISCHARGE PATH ACCORDING TO SIGNAL LEVEL OF AN INPUT SIGNAL

TECHNICAL FIELD

The disclosure is related to a switch device, and more particularly, a switch device capable of providing a discharge path according to the signal level of an input signal.

BACKGROUND

Regarding voltage generation, the generated voltage may be a positive voltage or a negative voltage used for controlling another circuit.

Usually, a negative voltage can be generated by a charge pump. The sourcing capability of the circuit generating a negative voltage is often weaker, so the generated negative voltage is easily affected by the discharge of accumulated positive charges. When the signal level of a terminal outputting a voltage is changed from a positive signal level to a negative signal level, accumulated positive charges may flow to the terminal to erroneously increase the generated negative voltage. Then, the generated negative voltage may be too high to erroneously operate the controlled circuit. Hence, a solution is in need for improving the quality of the provided voltage and reducing erroneous operations.

SUMMARY

An embodiment provides a switch device comprising a driver circuit, a switch circuit and a level transition circuit. The driver circuit comprises an input terminal configured to receive an input signal, an output terminal configured to output an output signal, a first terminal coupled to a first reference terminal, and a second terminal coupled to a second reference terminal. The switch circuit comprises a control terminal configured to receive the output signal. The level transition circuit comprises a first terminal configured to receive the output signal, a second terminal coupled to a third reference terminal, and a third terminal configured to receive the input signal. In a first transition interval, the input signal is transitioned from a first input signal level to a second input signal level, the level transition circuit transitions the output signal from a first output signal level to a third output signal level, and the third output signal level is between the first output signal level and a second output signal level.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

In order to generate stable voltages and prevent the signal level of the generated negative voltages from being too high, the switch devices described below can be used.

Figure 1:
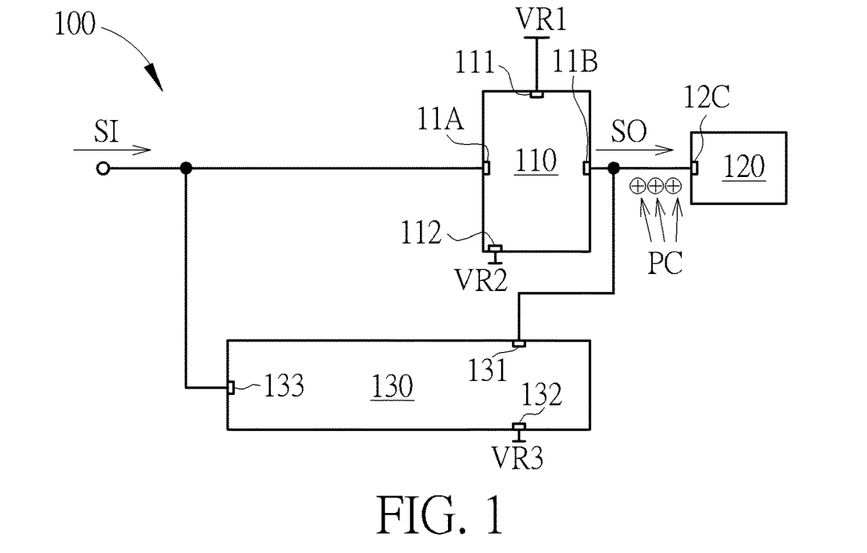
FIG. 1 illustrates a switch device according to an embodiment.

FIG. 1 illustrates a switch device 100 according to an embodiment. The switch device 100 can include a driver circuit 110, a switch circuit 120 and a level transition circuit 130.

The driver circuit 110 can include a first terminal 111, a second terminal 112, an input terminal 11A and an output terminal 11B. The input terminal 11A can receive an input signal SI, the output terminal 11B can output an output signal SO, the first terminal 111 can be coupled to a first reference terminal, and the second terminal 112 can be coupled to a second reference terminal.

The switch circuit 120 can include a control terminal 12C for receiving the output signal SO. The switch circuit 120 can include a single-pole single-throw (SPST) switch, a single-pole double-throw (SP2T) switch, or a switch of another type. The switch circuit 120 can be controlled by the output signal SO to control whether a radio-frequency signal can flow through the switch circuit 120.

The level transition circuit 130 can include a first terminal 131, a second terminal 132 and a third terminal 133. The first terminal 131 can receive the output signal SO. The second terminal 132 can be coupled to a third reference terminal. The third terminal 133 can receive the input signal SI.

Figure 2:
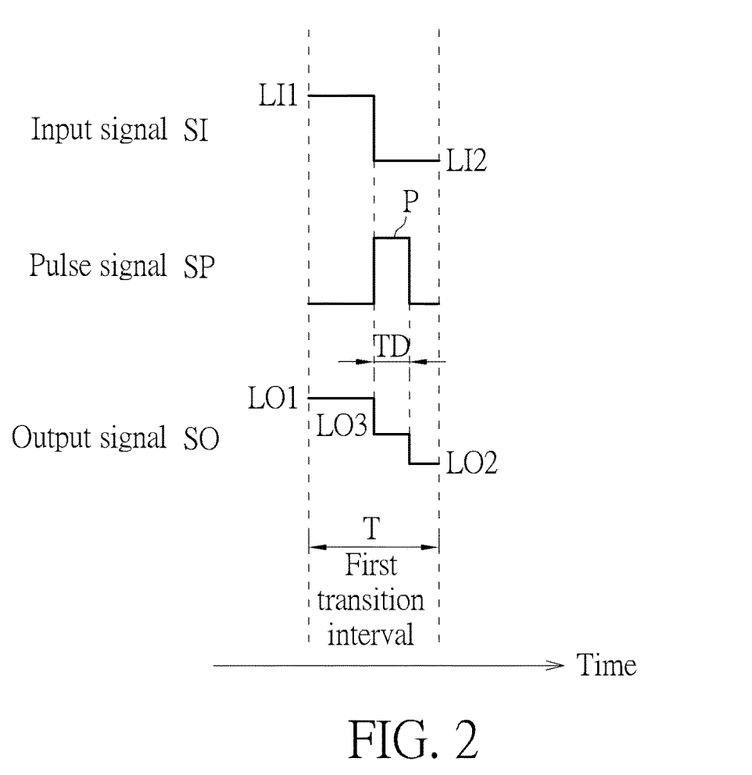
FIG. 2 illustrates waveforms of signals according to an embodiment.

The first reference terminal can receive a first reference signal VR1. A first output signal level LO1 of the output signal SO (as shown in FIG. 2) can be determined according to a signal level of the first reference signal VR1.

The second reference terminal can receive a second reference signal VR2. A second output signal level LO2 of the output signal SO (as shown in FIG. 2) can be determined according to a signal level of the second reference signal VR2.

The third reference terminal can receive a third reference signal VR3. A third output signal level LO3 of the output signal SO (as shown in FIG. 2) can be determined according to a signal level of the third reference signal VR3.

The signal level of the first reference signal VR1 can be a positive signal level. The signal level of the second reference signal VR2 can be a negative signal level.

The signal level of the third reference signal VR3 can be between the signal level of the first reference signal VR1 and the signal level of the second reference signal VR2. For example, signal level of the third reference signal VR3 can be a ground signal level.

FIG. 2 illustrates waveforms of signals according to an embodiment. In FIG. 2, waveforms of the input signal SI, the output signal SO and a pulse signal SP are shown. The pulse signal SP will be described below.

As shown in FIG. 1 and FIG. 2, in a first transition interval T, the input signal SI can be transitioned from a first input signal level LI1 to a second input signal level LI2, and the level transition circuit 130 can transition the output signal SO from the first output signal level LO1 to the third output signal level LO3, and then to the second output signal level LO2.

The third output signal level LO3 can be between the first output signal level LO1 and the second output signal level LO2, and it can expressed as LO1>LO3>LO2.

The first output signal level LO1 can be a positive signal level, the second output signal level LO2 can be a negative signal level, and the third output signal level LO3 can be (but not limited to) a ground signal level.

In the first transition interval T, the level transition circuit 130 can transition the output signal SO from the first output signal level LO1 to the third output signal level LO3 in a predetermined interval TD.

The first transition interval T can be between 200 nanoseconds and 500 nanoseconds. The predetermined interval TD can be between 20 nanoseconds and 30 nanoseconds.

As shown in FIG. 1, positive charges PC can be accumulated at the control terminal of the switch circuit 120. If the level transitions circuit 130 is omitted, when the output signal SO is transitioned from the first output signal level LO1 to the second output signal level LO2, the positive charges PC may flow to the output terminal 11B of the driver circuit 110, and this may unwantedly increase the signal level of the output signal SO. When the signal level of the output signal SO is expected to be a negative signal level, the signal level may not be low enough due to the positive charges PC flowing to the driver circuit 110, and this may cause an erroneous operation of the switch circuit 120.

In order to solve this problem, during an interval where the output signal SO is transitioned from the first output signal level LO1 to the second output signal level LO2 (e.g. from a positive signal level to a negative signal level), the level transitions circuit 130 can provide a discharge path for discharging the accumulated charges PC. Hence, the signal level of the output signal SO is prevented from being increase erroneously.

Figure 3:
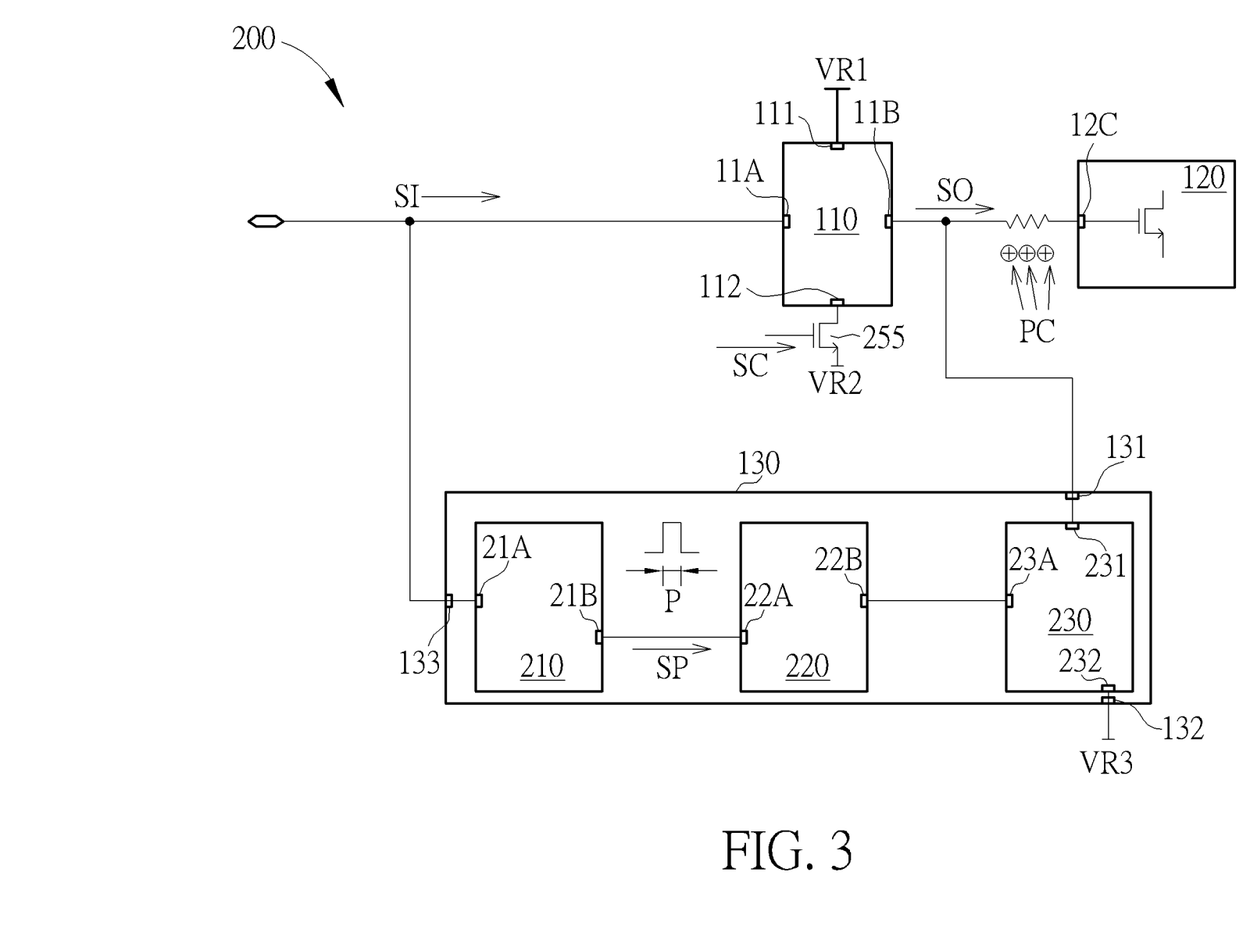
FIG. 3 illustrates the switch device according to an embodiment.

FIG. 3 illustrates the switch device 200 according to an embodiment. The switch device 200 can be one type of the switch device 100 in FIG. 1, but embodiments are not limited thereto.

The switch device 200 can further include a control switch 255. The second terminal 112 of the driver circuit 110 can be coupled to the second reference terminal through the control switch 255. In the predetermined interval TD, the control switch 255 can be turned off according to a control signal SC.

The level transition circuit 130 can include a pulse generation circuit 210, a conversion circuit 220 and an operation circuit 230.

The pulse generation circuit 210 can include an input terminal 21A and an output terminal 21B. The input terminal 21A can be coupled to the third terminal 133 of the level transition circuit 130. The output terminal 21B can output a pulse signal SP.

As shown in FIG. 2 and FIG. 3, the pulse signal SP can have a pulse P. The pulse P can have a higher signal level. In other words, the pulse P can be a positive pulse. However, this is an example, and embodiments are not limited thereto.

As shown in FIG. 1 to FIG. 3, in the first transition interval T and before the predetermined interval TD, the driver circuit 110 can output the output signal SO with the first output signal level LO1 according to the first input signal level LI1 of the input signal SI. In this example, the current or voltage of the input signal SI may be insufficient for driving the switch circuit 120, and the current or voltage of the output signal SO generated by the driver circuit 110 can be sufficient for driving the switch circuit 120.

As shown in FIG. 1 to FIG. 3, in the first transition interval T and after the output signal SO is transitioned from the first output signal level LO1 to the third output signal level LO3, the driver circuit 110 can output the output signal SO with the second output signal level LO2 according to the second input signal level LI2 of the input signal SI.

After the predetermined interval TD, the driver circuit 110 can output the output signal SO with the second output signal level LO2 according to the second input signal level LI2 of the input signal SI.

As shown in FIG. 3, the conversion circuit 220 can include an input terminal 22A and at least an output terminal 22B. The input terminal 22A can be coupled to the output terminal 21B of the pulse generation circuit 210 to receive the pulse signal SP. The output terminal 22B can output an operation signal to the operation circuit 230. The conversion circuit 220 can convert the signal level of the pulse signal SP to generate at least one operation signal(s) as described below. The conversion circuit 220 can be implemented with a conventional circuit design.

The operation circuit 230 can include a first terminal 231, a second terminal 232 and at least one operation terminal 23A. The first terminal 231 can be coupled to the first terminal 131 of the level transition circuit 130. The second terminal 232 can be coupled to the second terminal 132 of the level transition circuit 130. The operation terminal 23A can be coupled to the output terminal 22B of the conversion circuit 220 to receive the operation signal to control whether a discharge path between the first terminal 231 and the second terminal 232 is conductive, as described below.

The pulse signal SP can be related to the predetermined interval TD. For example, as shown in FIG. 2 and FIG. 3, the duration of the pulse P of the pulse signal SP can be substantially equal to the length of the predetermined interval TD. During the pulse P, the level transition circuit 130 can provide a discharge path to discharge the positive charges PC shown in FIG. 1 and FIG. 3

The pulse generation circuit 210 can generate the pulse signal SP when the pulse generation circuit 210 detects that the input signal SI is transitioned from the first input signal level LI1 to the second input signal level LI2.

Figure 4:
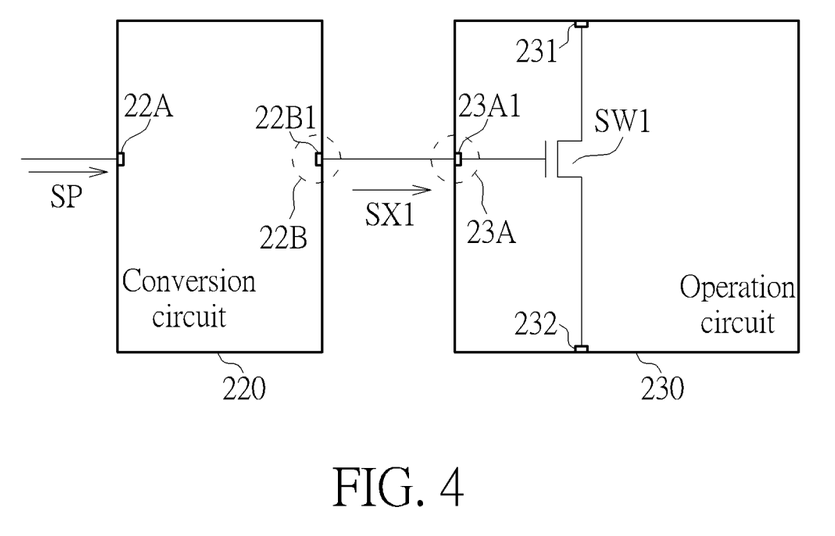
FIG. 4 to FIG. 6 illustrate the conversion circuit and the operation circuit in FIG. 3 according to different embodiments.

FIG. 4 illustrates the conversion circuit 220 and the operation circuit 230 in FIG. 3 according to an embodiment. As shown in FIG. 3 and FIG. 4, the at least one output terminal 22B can include a first output terminal 22B1, and the at least one operation terminal 23A of the operation circuit 230 can include a first operation terminal 23A1. The conversion circuit 220 can output a first operation signal SX1 to the operation circuit 230.

As shown in FIG. 3 and FIG. 4, the operation circuit 230 can include a switch SW1. The switch SW1 can include a first terminal, a second terminal and a control terminal, where the first terminal can be coupled to the first terminal 231 of the operation circuit 230, the second terminal can be coupled to the second terminal 232 of the operation circuit 230, and the control terminal can be coupled to the first operation terminal 23A1 of the operation circuit 230.

As shown in FIG. 2 and FIG. 4, in the first transition interval T, for example, in the predetermined interval TD (e.g. during the pulse P), the first operation signal SX1 can have a first operation signal level to turn on the switch SW1. For example, the first operation signal level can be the signal level of the first reference signal VR1, such as a positive signal level.

When the switch SW1 is turned on, the operation circuit 230 can provide a discharge path to discharge the positive charges PC in FIG. 1 and FIG. 3 to prevent the output signal SO from being erroneously increased. Hence, the signal level of the output signal SO is prevented from being too high.

In another scenario, when it is not in the predetermined interval TD (e.g. before or after the pulse P) and the output signal SO has been transitioned to the second output signal level LO2, the switch SW1 can be turned off to cut off the discharge path.

In the example of FIG. 2 and FIG. 4, the level of the first operation signal SX1 can be shown as Table 1.

TABLE 1

| Time | Before the pulse P | During the pulse P | After the pulse P |
| --- | --- | --- | --- |
| Signal level of the first operation signal SX1 | Signal level of the second reference signal VR2 or the third reference signal VR3 | Signal level of the first reference signal VR1 | Signal level of the second reference signal VR2 or the third reference signal VR3 |

Figure 5:
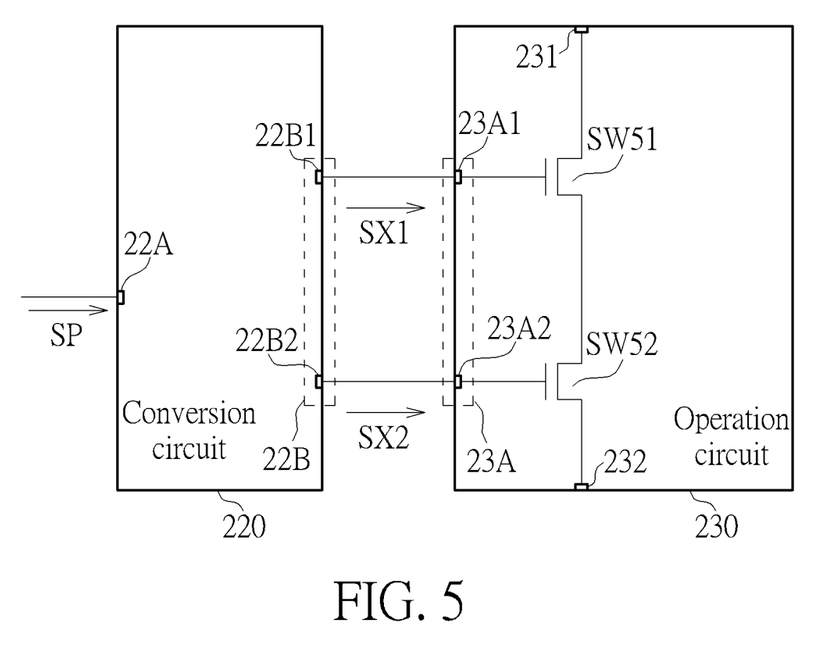

FIG. 5 illustrates the conversion circuit 220 and the operation circuit 230 in FIG. 3 according to another embodiment.

As shown in FIG. 3 and FIG. 5, the at least one output terminal 22B can include a first output terminal 22B1 and a second output terminal 22B2. The first output terminal 22B1 can output a first operation signal SX1 according to the pulse signal SP. The second output terminal 22B2 can output a second operation signal SX2 according to the pulse signal SP.

As shown in FIG. 5, the at least one operation terminal 23A of the operation circuit 230 can include a first operation terminal 23A1 and a second operation terminal 23A2. The first operation terminal 23A1 can be coupled to the first output terminal 22B1 of the conversion circuit 220 to receive the first operation signal SX1. The second operation terminal 23A2 can be coupled to the second output terminal 22B2 of the conversion circuit 220 to receive the second operation signal SX2.

The operation circuit 230 can include a first switch SW51 and a second switch SW52. The first switch SW51 can include a first terminal, a second terminal and a control terminal, where the first terminal can be coupled to the first terminal 231 of the operation circuit 230, and the control terminal can be coupled to the first operation terminal 23A1 of the operation circuit 230.

The second switch SW52 can include a first terminal, a second terminal and a control terminal, where the first terminal can be coupled to the second terminal of the first switch SW51, the second terminal coupled to the second terminal 232 of the operation circuit 230, and the control terminal can be coupled to the second operation terminal 23A2 of the operation circuit 230.

As shown in FIG. 2 and FIG. 5, in the first transition interval T (e.g. during the pulse P), the first operation signal SX1 can have a first operation signal level to turn on the first switch SW51, and the second operation signal SX2 can have the first operation signal level to turn on the second switch SW52. For example, the first operation signal level can be the signal level of the first reference signal VR1, such as a positive signal level.

When the first switch SW51 and the second switch SW52 are turned on, the operation circuit 230 can provide a discharge path to discharge the positive charges PC in FIG. 1 and FIG. 3 to prevent the output signal SO from being erroneously increased. Hence, the signal level of the output signal SO is prevented from being too high. In another scenario, when it is not in the predetermined interval TD (e.g. before or after the pulse P) and the output signal SO has been transitioned to the second output signal level LO2, the first switch SW51 and the second switch SW52 can be turned off to cut off the discharge path.

In the example of FIG. 2 and FIG. 5, the levels of the first operation signal SX1 and the second operation signal SX2 can be shown as Table 2.

TABLE 2

| Time | Before the pulse P | During the pulse P | After the pulse P |
| --- | --- | --- | --- |
| Signal level of the first operation signal SX1 | Signal level of the third reference signal VR3 | Signal level of the first reference signal VR1 | Signal level of the third reference signal VR3 |
| Signal level of the second operation signal SX2 | Signal level of the second reference signal VR2 | Signal level of the first reference signal VR1 | Signal level of the second reference signal VR2 |

Figure 6:
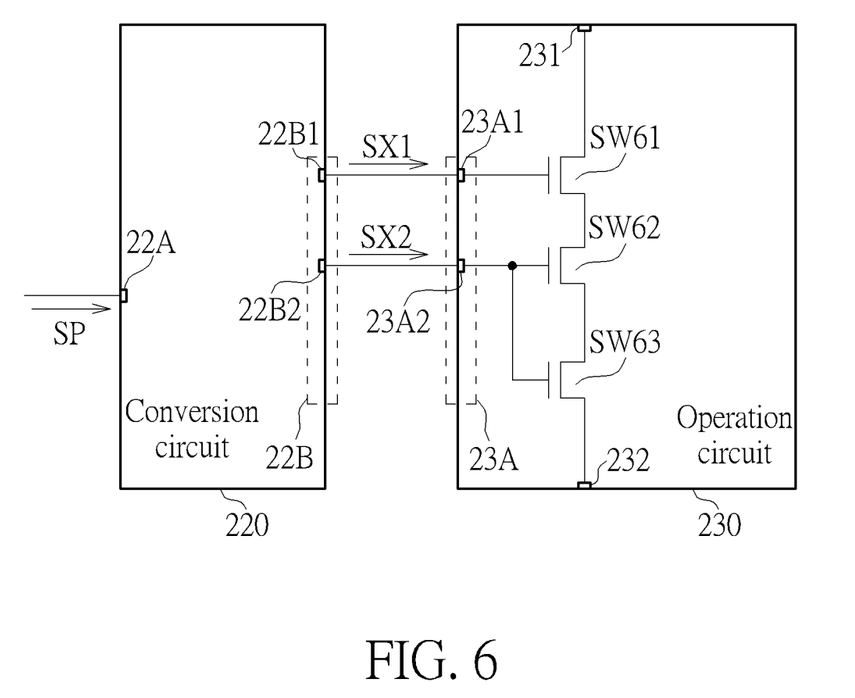

FIG. 6 illustrates the conversion circuit 220 and the operation circuit 230 in FIG. 3 according to another embodiment.

As shown in FIG. 3 and FIG. 6, the at least one output terminal 22B can include a first output terminal 22B1 and a second output terminal 22B2. The first output terminal 22B1 can output a first operation signal SX1 according to the pulse signal SP. The second output terminal 22B2 can output a second operation signal SX2 according to the pulse signal SP.

As shown in FIG. 6, the at least one operation terminal 23A of the operation circuit 230 can include a first operation terminal 23A1 and a second operation terminal 23A2. The first operation terminal 23A1 can be coupled to the first output terminal 22B1 of the conversion circuit 220 to receive the first operation signal SX1. The second operation terminal 23A2 can be coupled to the second output terminal 22B2 of the conversion circuit 220 to receive the second operation signal SX2.

The operation circuit 230 can include a first switch SW61, a second switch SW62 and a third switch SW63.

The first switch SW61 can include a first terminal, a second terminal and a control terminal, where the first terminal can be coupled to the first terminal 231 of the operation circuit 230, and the control terminal can be coupled to the first operation terminal 23A1 of the operation circuit 230.

The second switch SW62 can include a first terminal, a second terminal and a control terminal, where the first terminal can be coupled to the second terminal of the first switch SW61, and the control terminal can be coupled to the second operation terminal 23A2 of the operation circuit 230.

The third switch SW63 can include a first terminal, a second terminal and a control terminal, where the first terminal can be coupled to the second terminal of the second switch SW62, the second terminal can be coupled to the second terminal 232 of the operation circuit 230, and the control terminal can be coupled to the control terminal of the second switch SW62. Compared with FIG. 3, the risk of the breakdown of the operation circuit 230 can be reduced by further using the third switch SW63.

As shown in FIG. 2 and FIG. 6, in the first transition interval T, for example, in the predetermined interval TD (e.g. during the pulse P), the first operation signal SX1 can have a first operation signal level to turn on the first switch SW61, and the second operation signal SX2 can have the first operation signal level to turn on the second switch SW62 and the third switch SW63. For example, the first operation signal level can be the signal level of the first reference signal VR1, such as a positive signal level.

When the first switch SW61, the second switch SW62 and the third switch SW63 are turned on, the operation circuit 230 can provide a discharge path to discharge the positive charges PC in FIG. 1 and FIG. 3 to prevent the output signal SO from being erroneously increased. Hence, the signal level of the output signal SO is prevented from being too high. In another scenario, when it is not in the predetermined interval TD (e.g. before or after the pulse P) and the output signal SO has been transitioned to the second output signal level LO2, the first switch SW61, the second switch SW62 and the third switch SW63 can be turned off to cut off the discharge path.

In the example of FIG. 2 and FIG. 6, the levels of the first operation signal SX1 and the second operation signal SX2 can be shown as Table 3.

TABLE 3

| Time | Before the pulse P | During the pulse P | After the pulse P |
|---|---|---|---|
| Signal level of the first operation signal SX1 | Signal level of the third reference signal VR3 | Signal level of the first reference signal VR1 | Signal level of the third reference signal VR3 |
| Signal level of the second operation signal SX2 | Signal level of the second reference signal VR2 | Signal level of the first reference signal VR1 | Signal level of the second reference signal VR2 |

Figure 7:
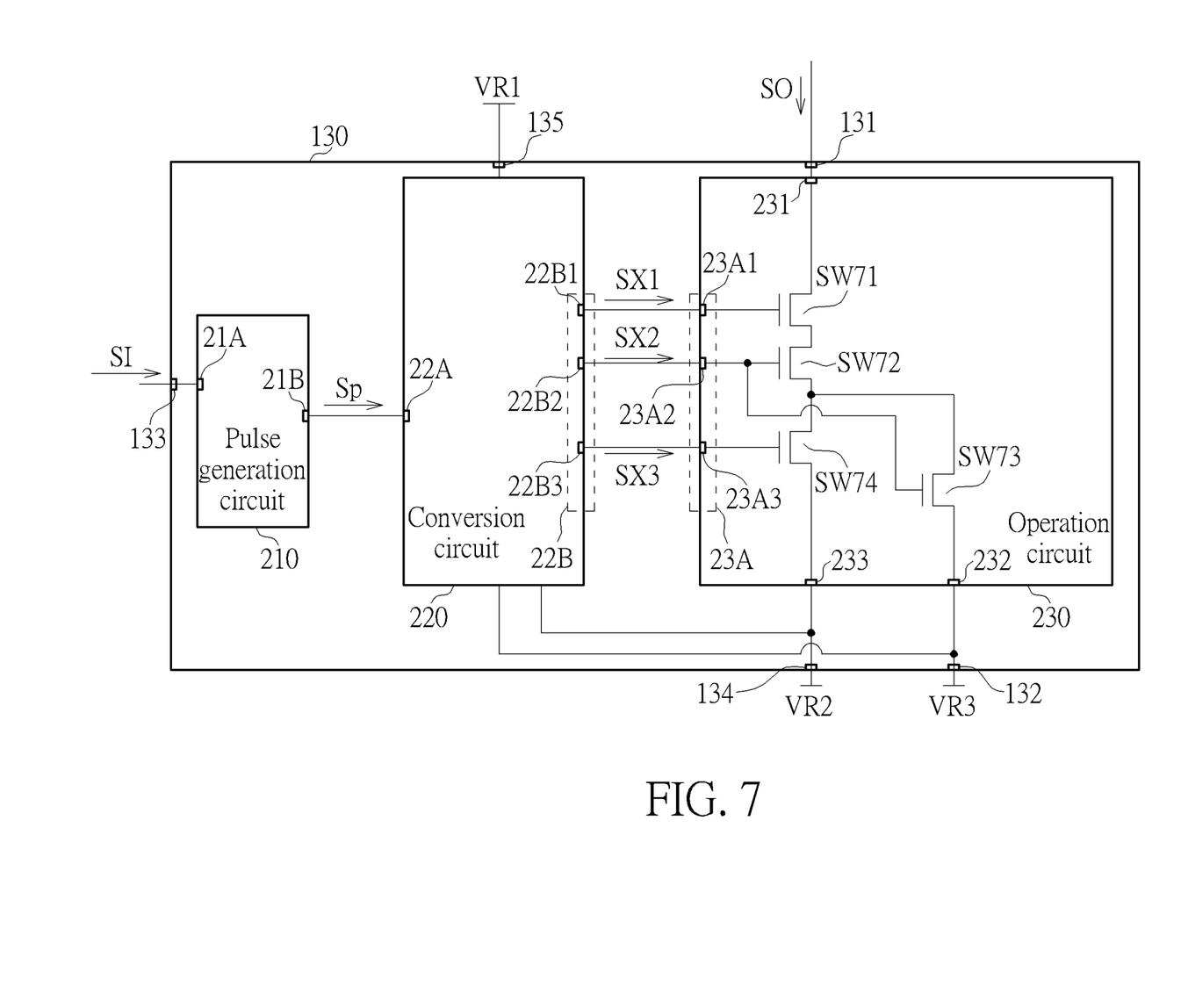
FIG. 7 illustrates the level transition circuit in FIG. 1 and FIG. 3 according to another embodiment.

FIG. 7 illustrates the level transition circuit 130 in FIG. 1 and FIG. 3 according to another embodiment. Compare with FIG. 3, the level transition circuit 130 in FIG. 7 can further include a fourth terminal 134 coupled to the second reference terminal for receiving the second reference signal VR2.

Compared with FIG. 3, in FIG. 7, the operation circuit 230 can further include a third terminal 233 coupled to the fourth terminal 134 of the level transition circuit 130.

As shown in FIG. 7, the at least one output terminal 22B can include a first output terminal 22B1, a second output terminal 22B2 and a third output terminal 22B3. The first output terminal 22B1 can output a first operation signal SX1 according to the pulse signal SP. The second output terminal 22B2 can output a second operation signal SX2 according to the pulse signal SP. The third output terminal 22B3 can output a third operation signal SX3 according to the pulse signal SP.

The at least one operation terminal 23A of the operation circuit 230 can include a first operation terminal 23A1, a second operation terminal 23A2 and a third operation terminal 23A3. The first operation terminal 23A1 can be coupled to the first output terminal 22B1 of the conversion circuit 220 to receive the first operation signal SX1. The second operation terminal 23A2 can be coupled to the second output terminal 22B2 of the conversion circuit 220 to receive the second operation signal SX2. The third operation terminal 23A3 can be coupled to the third output terminal 22B3 of the conversion circuit 220 to receive the third operation signal SX3.

The operation circuit 230 can include a first switch SW71, a second switch SW72, a third switch SW73 and a fourth switch SW74.

The first switch SW71 can include a first terminal, a second terminal and a control terminal, where the first terminal can be coupled to the first terminal 231 of the operation circuit 230, and the control terminal can be coupled to the first operation terminal 23A1 of the operation circuit 230.

The second switch SW72 can include a first terminal, a second terminal and a control terminal, where the first terminal can be coupled to the second terminal of the first switch SW71, and the control terminal can be coupled to the second operation terminal 23A2 of the operation circuit 230.

The third switch SW73 can include a first terminal, a second terminal and a control terminal, where the first terminal can be coupled to the second terminal of the second switch SW72, the second terminal can be coupled to the second terminal 232 of the operation circuit 230, and the control terminal can be coupled to the control terminal of the second switch SW72.

The fourth switch SW74 can include a first terminal, a second terminal and a control terminal, where the first terminal can be coupled to the second terminal of the second switch SW72, the second terminal can be coupled to the third terminal 233 of the operation circuit 230, and the control terminal can be coupled to the third operation terminal 23A3 of the operation circuit 230. Compared with FIG. 3, the risk of the breakdown of the operation circuit 230 can be reduced by further using the third switch SW73 and the fourth switch SW74.

As shown in FIG. 2 and FIG. 7, in the first transition interval T, for example, in the predetermined interval TD (e.g. during the pulse P), the first operation signal SX1 can have a first operation signal level to turn on the first switch SW71, the second operation signal SX2 can have the first operation signal level to turn on the second switch SW72 and the third switch SW73, and the third operation signal SX3 can have the second operation signal level to turn off the fourth switch SW74. For example, the second operation signal level can be the signal level of the second reference signal VR2, such as a negative signal level.

When the first switch SW71, the second switch SW72 and the third switch SW73 are turned on, the operation circuit 230 can provide a discharge path to discharge the positive charges PC in FIG. 1 and FIG. 3 to prevent the output signal SO from being erroneously increased. Hence, the signal level of the output signal SO is prevented from being too high.

In another scenario, when it is not in the predetermined interval TD (e.g. before or after the pulse P) and the output signal SO has been transitioned to the second output signal level LO2, the first switch SW71, the second switch SW72 and the third switch SW73 can be turned off, and the fourth switch SW74 can be turned on, so the discharge path is cut off.

In the example of FIG. 2 and FIG. 7, the levels of the first operation signal SX1, the second operation signal SX2 and the third operation signal SX3 can be shown as Table 4.

TABLE 4

| Time | Before the pulse P | During the pulse P | After the pulse P |
| --- | --- | --- | --- |
| Signal level of the first operation signal SX1 | Signal level of the third reference signal VR3 | Signal level of the first reference signal VR1 | Signal level of the third reference signal VR3 |
| Signal level of the second operation signal SX2 | Signal level of the second reference signal VR2 | Signal level of the first reference signal VR1 | Signal level of the second reference signal VR2 |
| Signal level of the third operation signal SX3 | Signal level of the third reference signal VR3 | Signal level of the second reference signal VR2 | Signal level of the third reference signal VR3 |

For example, each of the first switch SW71, the second switch SW72, the third switch SW73 and the fourth switch SW74 can include an N-type transistor. Hence, when the voltage level at the control terminal of the switch is a low voltage level, the switch can be turned off. When the voltage level at the control terminal of the switch is a high voltage level, the switch can be turned on.

As shown in FIG. 4 to FIG. 7, the operation signal(s) outputted by the conversion circuit 220 can have the signal level(s) of the first reference signal VR1, the second reference signal VR2 and/or the third reference signal VR3. Hence, the conversion circuit 220 can be coupled to the first reference terminal, the second reference terminal and/or the third reference terminal to receive the first reference signal VR1, the second reference signal VR2 and/or the third reference signal VR3. In another embodiment, the operation circuit 230 can further have terminals coupled to the conversion circuit 220 for the conversion circuit 220 to receive the reference signals through the operation circuit 230.

For example, as shown in FIG. 7, the conversion circuit 220 can be coupled to the second terminal 132 and the fourth terminal 134 of the level transition circuit 130 to receive the second reference signal VR2 and the third reference signal VR3. The level transition circuit 130 can further include a fifth terminal 135 coupled to the first reference terminal, and the conversion circuit 220 can be coupled to the fifth terminal 135 of the level transition circuit 130 to receive the first reference signal VR1. FIG. 7 is an example, and embodiments are not limited thereto.

Figure 8:
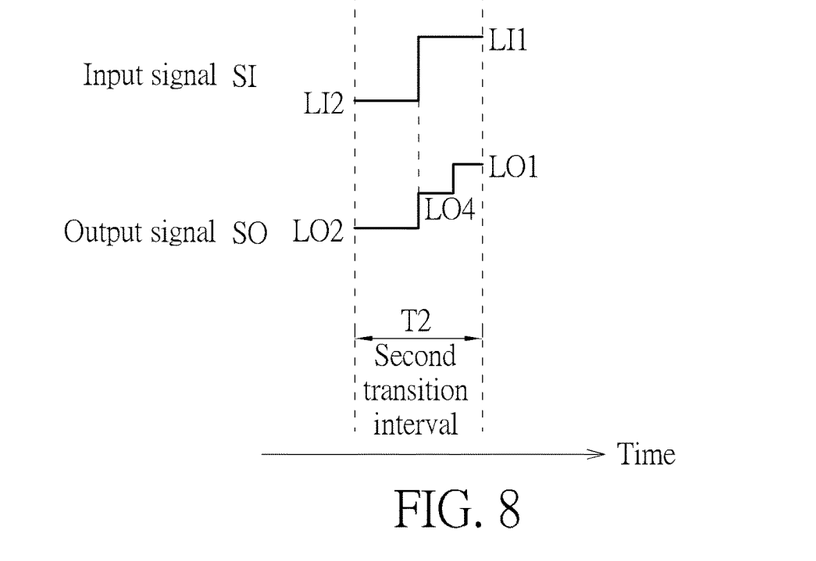
FIG. 8 illustrates waveforms of signals in FIG. 1 and FIG. 3 according to an embodiment.

FIG. 8 illustrates waveforms of signals in FIG. 1 and FIG. 3 according to an embodiment. As shown in FIG. 8, in the second transition interval T2, the input signal SI can be transitioned from the second input signal level LI2 to the first input signal level LI1.

The second transition interval T2 can precede the first transition interval T, or proceed the first transition interval T.

As shown in FIG. 8, the level transition circuit 130 in FIG. 1 and FIG. 3 can transition the output signal SO from the second output signal level LO2 to a fourth output signal level LO4, and then transition the output signal SO from the fourth output signal level LO4 to the first output signal level LO1.

The fourth output signal level LO4 can be between the first output signal level LO1 and the second output signal level LO2. The fourth output signal level LO4 may be the same as or different from the third output signal level LO3 described in FIG. 2.

Figure 9:
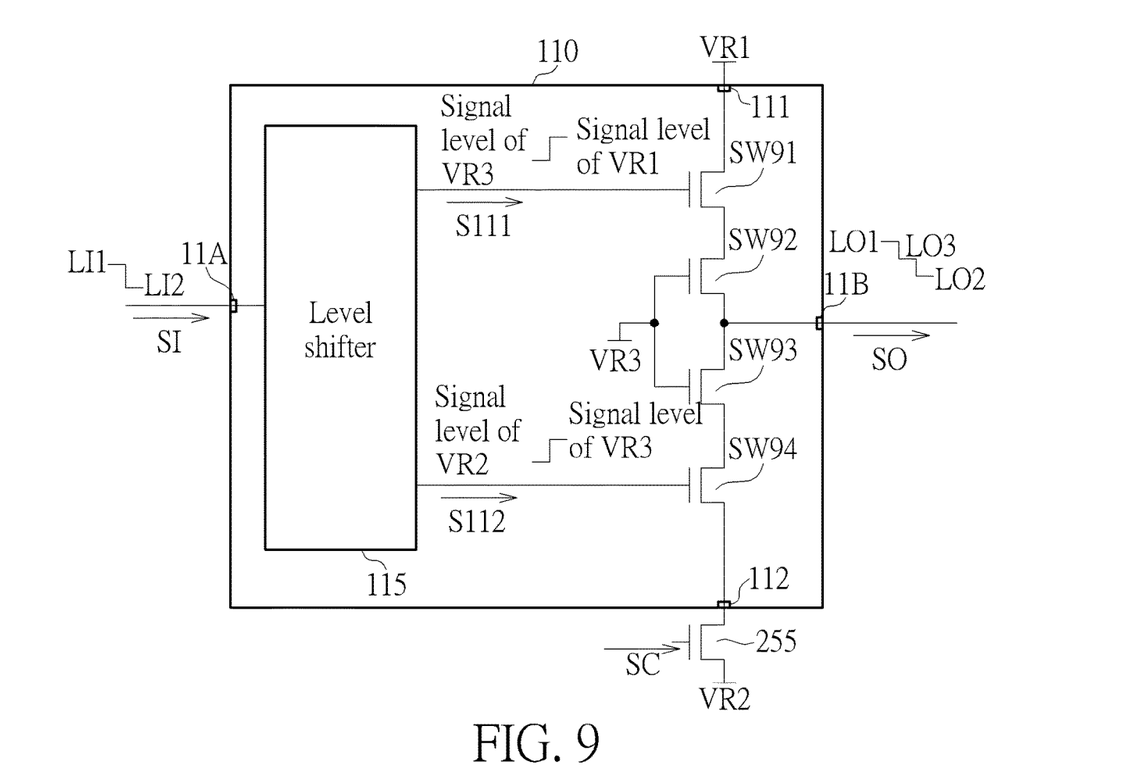
FIG. 9 illustrates the driver circuit in FIG. 3 according to an embodiment.

FIG. 9 illustrates the driver circuit in FIG. 3 according to an embodiment. FIG. 3 is an example, and embodiments are not limited thereto. As shown in FIG. 9, the driver circuit 110 can include a level shifter 115, and switches SW91, SW92, SW93 and SW94. The level shifter 115 can shift the signal level of the input signal SI to generate one or more control signal(s) with one signal level or different signal levels. The level shifter 115 can be implemented according to a conventional design.

The couplings among the level shifter 115 and the switches SW91, SW92, SW93 and SW94 can be as shown in FIG. 9.

For example, the switches SW91 and SW92 can include P-type transistors, so they can be turned on by signals with a low voltage level. The switches SW93 and SW94 can include N-type transistors, so they can be turned on by signals with a high voltage level.

The level shifter 115 can output control signals S111 and S112 to the switches SW91 and SW94 respectively according to the input signal SI. The control terminals of the switches SW92 and SW93 can be coupled to the third reference terminal to receive the third reference signal VR3.

In FIG. 9, when the input signal SI is transitioned from the first input signal level LI1 to the second input signal level LI2, the level shifter 115 can transition the control signal S111 from the signal level of the third reference signal VR3 to the signal level of the first reference signal VR1, and transition the control signal S112 from the signal level of the second reference signal VR2 to the signal level of the third reference signal VR3.

If the first reference signal VR1, the second reference signal VR2 and the third reference signal VR3 have a positive signal level, a negative signal level and a ground signal level respectively, the output signal SO can be transitioned from a high signal level to a low signal level. For example, the output signal SO can be transitioned from the first output signal level LO1 to the second output signal level LO2 as shown in FIG. 9.

In summary, by using the switch devices 100 and 200 and the circuits shown in FIG. 1 and FIG. 3 to FIG. 7, a discharge path can be generated for discharging the accumulated positive charges PC when the driver circuit 110 provides the output signal SO with a negative signal level. The output signal SO can be prevented from being increased erroneously. Hence, the generated negative positive voltage will not be too high. Likewise, the discharge path can be used to discharge accumulated negative charges to avoid decreasing a generated positive voltage erroneously. Hence, the erroneous operations of the switch circuit 120 can be effectively reduced, and the long-standing problems in the field could be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switch device, comprising:
  a driver circuit comprising an input terminal configured to receive an input signal, an output terminal configured to output an output signal, a first terminal coupled to a first reference terminal, and a second terminal coupled to a second reference terminal;
  a switch circuit comprising a control terminal configured to receive the output signal; and
  a level transition circuit configured to provide a discharge path used to discharge accumulated electric charges at the control terminal of the switch circuit to a third reference terminal, and comprising:
    a first terminal configured to receive the output signal;

a second terminal coupled to the third reference terminal;

a third terminal configured to receive the input signal;

a pulse generation circuit comprising an input terminal coupled to the third terminal of the level transition circuit, and an output terminal configured to output a pulse signal;

a conversion circuit comprising an input terminal configured to receive the pulse signal, and a first output terminal configured to output a first operation signal according to the pulse signal; and an operation circuit comprising a first terminal coupled to the first terminal of the level transition circuit, a second terminal coupled to the second terminal of the level transition circuit, and a first operation terminal coupled to the first output terminal of the conversion circuit and configured to receive the first operation signal;

wherein:

in a first transition interval, the input signal is transitioned from a first input signal level to a second input signal level, the level transition circuit transitions the output signal from a first output signal level to a third output signal level, the third output signal level is between the first output signal level and a second output signal level, and the level transition circuit transitions the output signal from the first output signal level to the third output signal level in a predetermined interval; and the pulse signal is related to the predetermined interval.

2. The switch device of claim 1, wherein the third reference terminal is configured to receive a third reference signal, and the third output signal level of the output signal is determined according to a signal level of the third reference signal.

3. The switch device of claim 1, wherein the predetermined interval is between 20 nanoseconds and 30 nanoseconds.

4. The switch device of claim 1, further comprising a control switch, wherein:

the second terminal of the driver circuit is coupled to the second reference terminal through the control switch; and in the predetermined interval, the control switch is turned off according to a control signal.

5. The switch device of claim 1, wherein:

in the first transition interval and before the predetermined interval, the driver circuit outputs the output signal with the first output signal level according to the first input signal level of the input signal; and in the first transition interval and after the output signal is transitioned from the first output signal level to the third output signal level, the driver circuit outputs the output signal with the second output signal level according to the second input signal level of the input signal.

6. The switch device of claim 1, wherein the pulse generation circuit is configured to generate the pulse signal when the pulse generation circuit detects that the input signal is transitioned from the first input signal level to the second input signal level.

7. The switch device of claim 1, wherein the operation circuit further comprises:

a first switch comprising a first terminal coupled to the first terminal of the operation circuit, a second terminal coupled to the second terminal of the operation circuit, and a control terminal coupled to the first operation terminal of the operation circuit.

8. The switch device of claim 7, wherein:

in the predetermined interval, the first operation signal has a first operation signal level to turn on the first switch.

9. The switch device of claim 1, wherein:

the conversion circuit further comprises a second output terminal configured to output a second operation signal according to the pulse signal; and the operation circuit further comprises:

a second operation terminal coupled to the second output terminal of the conversion circuit and configured to receive the second operation signal;

a first switch comprising a first terminal coupled to the first terminal of the operation circuit, a second terminal, and a control terminal coupled to the first operation terminal of the operation circuit; and a second switch comprising a first terminal coupled to the second terminal of the first switch, a second terminal coupled to the second terminal of the operation circuit, and a control terminal coupled to the second operation terminal of the operation circuit.

10. The switch device of claim 9, wherein in the predetermined interval, the first operation signal has a first operation signal level to turn on the first switch, and the second operation signal has the first operation signal level to turn on the second switch.

11. The switch device of claim 1, wherein:

the conversion circuit further comprises a second output terminal configured to output a second operation signal according to the pulse signal; and the operation circuit further comprises:

a second operation terminal coupled to the second output terminal of the conversion circuit and configured to receive the second operation signal;

a first switch comprising a first terminal coupled to the first terminal of the operation circuit, a second terminal, and a control terminal coupled to the first operation terminal of the operation circuit;

a second switch comprising a first terminal coupled to the second terminal of the first switch, a second terminal, and a control terminal coupled to the second operation terminal of the operation circuit; and a third switch comprising a first terminal coupled to the second terminal of the second switch, a second terminal coupled to the second terminal of the operation circuit, and a control terminal coupled to the control terminal of the second switch.

12. The switch device of claim 11, wherein in the predetermined interval, the first operation signal has a first operation signal level to turn on the first switch, and the second operation signal has the first operation signal level to turn on the second switch and the third switch.

13. The switch device of claim 1, wherein:

the level transition circuit further comprises a fourth terminal coupled to the second reference terminal;

the conversion circuit further comprises a second output terminal configured to output a second operation signal according to the pulse signal, and a third output terminal configured to output a third operation signal according to the pulse signal; and the operation circuit further comprises:

a third terminal coupled to the fourth terminal of the level transition circuit;

a second operation terminal coupled to the second output terminal of the conversion circuit and configured to receive the second operation signal;

a third operation terminal coupled to the third output terminal of the conversion circuit and configured to receive the third operation signal;

a first switch comprising a first terminal coupled to the first terminal of the operation circuit, a second terminal, and a control terminal coupled to the first operation terminal of the operation circuit;

a second switch comprising a first terminal coupled to the second terminal of the first switch, a second terminal, and a control terminal coupled to the second operation terminal of the operation circuit;

a third switch comprising a first terminal coupled to the second terminal of the second switch, a second terminal coupled to the second terminal of the operation circuit, and a control terminal coupled to the control terminal of the second switch; and a fourth switch comprising a first terminal coupled to the second terminal of the second switch, a second terminal coupled to the third terminal of the operation circuit, and a control terminal coupled to the third operation terminal of the operation circuit.

14. The switch device of claim 13, wherein in the predetermined interval, the first operation signal has a first operation signal level to turn on the first switch, the second operation signal has the first operation signal level to turn on the second switch and the third switch, and the third operation signal has a second operation signal level to turn off the fourth switch.

15. The switch device of claim 13, wherein each of the first switch, the second switch, the third switch and the fourth switch comprises an N-type transistor.

16. The switch device of claim 1, wherein the first reference terminal is configured to receive a first reference signal, and the first output signal level of the output signal is determined according to a signal level of the first reference signal.

17. The switch device of claim 1, wherein the second reference terminal is configured to receive a second reference signal, and the second output signal level of the output signal is determined according to a signal level of the second reference signal.

18. The switch device of claim 1, wherein in a second transition interval, the input signal is transitioned from the second input signal level to the first input signal level, the level transition circuit transitions the output signal from the second output signal level to a fourth output signal level, and the fourth output signal level is between the first output signal level and the second output signal level.

19. The switch device of claim 1, wherein:

the output signal outputted from the output terminal of the driver circuit is generated according to at least a signal provided by a charge pump.

* * * * *